United States Patent
Yeo et al.

(10) Patent No.: US 9,835,707 B2
(45) Date of Patent: Dec. 5, 2017

(54) SYSTEM AND METHOD FOR ESTIMATING A STATIC MAGNETIC FIELD

(71) Applicant: General Electric Company, Schenectady, NY (US)

(72) Inventors: Desmond Teck Beng Yeo, Clifton Park, NY (US); Lorne Wyatt Hofstetter, Salt Lake City, UT (US)

(73) Assignee: General Electric Company, Niskayuna, NY (US)

( * ) Notice: Subject to any disclaimer, the term of this patent is extended or adjusted under 35 U.S.C. 154(b) by 595 days.

(21) Appl. No.: 14/474,530

(22) Filed: Sep. 2, 2014

(65) Prior Publication Data

US 2016/0061918 A1 Mar. 3, 2016

(51) Int. Cl.
*G01V 3/00* (2006.01)
*G01R 33/56* (2006.01)
*G01R 33/24* (2006.01)

(52) U.S. Cl.
CPC ....... *G01R 33/5607* (2013.01); *G01R 33/243* (2013.01)

(58) Field of Classification Search
CPC .............. G01R 33/3415; G01R 33/543; G01R 33/5659; G01R 33/36; A61B 5/055
USPC .......................................................... 324/309
See application file for complete search history.

(56) References Cited

U.S. PATENT DOCUMENTS

| | | | |
|---|---|---|---|
| 5,225,781 A * | 7/1993 | Glover ................. | G01R 33/485 324/309 |
| 7,795,870 B2 | 9/2010 | Sodickson et al. | |
| 8,558,547 B2 | 10/2013 | Sacolick et al. | |
| 2001/0045831 A1 | 11/2001 | Ross et al. | |
| 2005/0030024 A1* | 2/2005 | Golay .................. | G01R 33/561 324/307 |
| 2008/0111547 A1* | 5/2008 | Alsop ................ | G01R 33/5617 324/309 |
| 2008/0240530 A1 | 10/2008 | Reese et al. | |

(Continued)

FOREIGN PATENT DOCUMENTS

EP 2584369 A1 4/2013

OTHER PUBLICATIONS

Author not mentioned, webpage "Inversion Recovery" downloaded Sep. 10, 2014 from University of Virginia webpage "http://www.med-ed.virginia.edu/courses/rad/cardiacmr/Techniques/Inversion.html".

(Continued)

*Primary Examiner* — Walter L Lindsay, Jr.
*Assistant Examiner* — Frederick Wenderoth
(74) *Attorney, Agent, or Firm* — Pabitra K. Chakrabarti (57) ABSTRACT

A method includes applying a preparatory radiofrequency (RF) pulse at a first time instant to a Magnetic Resonance (MR) scanner configured to scan an object comprising a plurality of chemical species. The method further includes applying a phase sensitive pulse sequence at a second time instant to the MR scanner, wherein the preparatory RF pulse and a time delay between the first and the second time instants null a first subset of chemical species from the plurality of chemical species. The method further includes receiving an output signal from a second subset of chemical species from the plurality of chemical species in response to the phase sensitive pulse sequence. The method also includes estimating a static magnetic field map based on the output signal from the second subset of chemical species.

20 Claims, 5 Drawing Sheets

(56) References Cited

U.S. PATENT DOCUMENTS

2010/0237861 A1    9/2010   Hennel
2011/0254547 A1*  10/2011   Reeder ............... G01R 33/4828
                                                        324/309
2011/0304335 A1*  12/2011   Fenchel ................ A61B 6/037
                                                        324/318

OTHER PUBLICATIONS

Maudsley et al., "Magnetic field measurement by NMR imaging", Journal of Physics E: Scientific Instruments, vol. 17, No. 3, pp. 216-220, 1984.

Sekihara et al., "A new method of measuring static field distribution using modified Fourier NMR imaging", Journal of Physics E: Scientific Instruments, vol. 18, No. 3, pp. 224-227, 1985.

Park et al., "Real-Value Representation in Inversion-Recovery NMR Imaging by Use of a Phase-Correction Method", Journal of Magnetic Resonance in Medicine, vol. 3, Issue 1, pp. 15-23, 1986.

Li et al., "Three-Dimensional Mapping of the Static Magnetic Field Inside the Human Head", Magnetic Resonance in Medicine, vol. 36, Issue 5, pp. 705-714, 1996.

Kellman et al., "Phase-Sensitive Inversion Recovery for Detecting Myocardial Infarction Using Gadolinium-Delayed Hyperenhancement", Magnetic Resonance in Medicine, vol. 47, Issue 2, pp. 372-383, Feb. 2002.

Bolan et al., "Measurement and Correction of Respiration-Induced B0 Variations in Breast 1H MRS at 4 Tesla", Magnetic Resonance in Medicine, vol. 52, Issue 6, pp. 1239-1245, Dec. 2004.

Maril et al.,"Strategies for Shimming the Breast", Magnetic Resonance in Medicine, vol. 54, Issue 5, pp. 1139-1145, Nov. 2005.

Hendrick, "Fast-spin Echo, Echo Planar, Inversion Recovery, and Short-T1 Inversion Recovery Imaging", chapter 6, pp. 75-91, in book "Breast MRI: Fundamentals and Technical Aspects", Springer, 2008.

Frollo et al., "Measurement and Imaging of Planar Electromagnetic Phantoms Based on NMR Imaging Methods", Measurement Science Review, vol. 10, No. 3, pp. 97-101, 2010.

Hancu et al., "On Shimming Approaches in 3T Breast MRI", Journal of Magnetic Resonance in Medicine, vol. 69, pp. 862-867, 2013.

Jordan et al., "Subject-Specific Models of Susceptibility-Induced B0 Field Variations in Breast MRI", Journal of Magnetic Resonance in Medicine, vol. 37, pp. 227-232, 2013.

Lee et al., "Patient-to-Patient Variation of Susceptibility-Induced B0 Field in Bilateral Breast MRI", Journal of Magnetic Resonance Imaging, vol. 36, Issue 4, pp. 873-880, Oct. 2012.

* cited by examiner

SYSTEM AND METHOD FOR ESTIMATING A STATIC MAGNETIC FIELD

BACKGROUND

The technology disclosed herein generally relates to magnetic resonance (MR) imaging. More specifically, the subject matter relates to estimating a static magnetic (B0) field in MR systems by applying a preparatory radiofrequency (RF) pulse.

In magnetic resonance imaging, the image quality is dependent on the homogeneity of the B0 field. When an object (e.g., a human) is placed inside an MR system, the object's shape, size, magnetic susceptibility, and the like can disrupt the B0 field homogeneity. The B0 field inhomogeneity is often corrected by adjusting the shim coils in the MR systems and/or applying post-processing techniques. However, to correct the B0 field inhomogeneity using shim coils or post-processing techniques, the inhomogeneity of the B0 field needs to be estimated. Currently, image based techniques (e.g., spin echo imaging protocol, gradient imaging protocol, and the like) are used to estimate the B0 field maps. The B0 field maps estimated by such image based techniques are inaccurate since they are confounded by the presence of a plurality of chemical species (e.g., water, fat, bone marrow, cartilage, and the like) in the object.

Thus, there is a need for an enhanced system and method for estimating B0 field maps in MR systems.

BRIEF DESCRIPTION

In accordance with one aspect of the present technique, a method includes applying a preparatory radiofrequency (RF) pulse at a first time instant to a Magnetic Resonance (MR) scanner configured to scan an object comprising a plurality of chemical species. The method further includes applying a phase sensitive pulse sequence at a second time instant to the MR scanner, wherein the preparatory RF pulse and a time delay between the first and the second time instants null a first subset of chemical species from the plurality of chemical species. The method further includes receiving an output signal from a second subset of chemical species from the plurality of chemical species in response to the phase sensitive pulse sequence. The method also includes estimating a static magnetic (B0) field map based on the output signal from the second subset of chemical species.

In accordance with one aspect of the present system, a system includes a sequence generator configured to apply a preparatory RF pulse at a first time instant to an MR scanner and apply a phase sensitive pulse sequence at a second time instant to the MR scanner, wherein the preparatory RF pulse and a time delay between the first and the second time instants null a first subset of chemical species from the plurality of chemical species. The system further includes a magnetic field module configured to receive an output signal from a second subset of chemical species from the plurality of chemical species in response to the phase sensitive pulse sequence and estimate a B0 field map based on the output signal from the second subset of chemical species.

In accordance with another aspect of the present technique, a computer program product encoding instructions is disclosed. The instructions when executed by a processor cause the processor to apply a preparatory RF pulse at a first time instant to an MR scanner configured to scan an object comprising a plurality of chemical species. The instructions further cause the processor to apply a phase sensitive pulse sequence at a second time instant to the MR scanner, wherein the preparatory RF pulse and a time delay between the first and the second time instants null a first subset of chemical species from the plurality of chemical species. The instructions further cause the processor to receive an output signal from a second subset of chemical species from the plurality of chemical species in response to the phase sensitive pulse sequence. The instructions also cause the processor to estimate a B0 field map based on the output signal from the second subset of chemical species.

DRAWINGS

These and other features, aspects, and advantages of the present inventions will become better understood when the following detailed description is read with reference to the accompanying drawings in which like characters represent like parts throughout the drawings, wherein.

DETAILED DESCRIPTION

In the following specification and the claims, reference will be made to a number of terms, which shall be defined to have the following meanings.

The singular forms "a", "an", and "the" include plural references unless the context clearly dictates otherwise.

As used herein, the term "non-transitory computer-readable media" is intended to be representative of any tangible computer-based device implemented in any method or technology for short-term and long-term storage of information, such as, computer-readable instructions, data structures, program modules and sub-modules, or other data in any device. Therefore, the methods described herein may be encoded as executable instructions embodied in a tangible, non-transitory, computer readable medium, including, without limitation, a storage device and/or a memory device. Such instructions, when executed by a processor, cause the processor to perform at least a portion of the methods described herein. Moreover, as used herein, the term "non-transitory computer-readable media" includes all tangible, computer-readable media, including, without limitation, non-transitory computer storage devices, including, without limitation, volatile and nonvolatile media, and removable and non-removable media such as a firmware, physical and virtual storage, CD-ROMs, DVDs, and any other digital source such as a network or the Internet, as well as yet to be developed digital means, with the sole exception being a transitory, propagating signal.

As used herein, the terms "software" and "firmware" are interchangeable, and include any computer program stored in memory for execution by devices that include, without limitation, mobile devices, clusters, personal computers, workstations, clients, and servers.

As used herein, the term "computer" and related terms, e.g., "computing device", are not limited to integrated circuits referred to in the art as a computer, but broadly refers to at least one microcontroller, microcomputer, programmable logic controller (PLC), application specific integrated circuit, and other programmable circuits, and these terms are used interchangeably herein.

Approximating language, as used herein throughout the specification and claims, may be applied to modify any quantitative representation that could permissibly vary without resulting in a change in the basic function to which it is related. Accordingly, a value modified by a term or terms, such as "about" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

Figure 1:
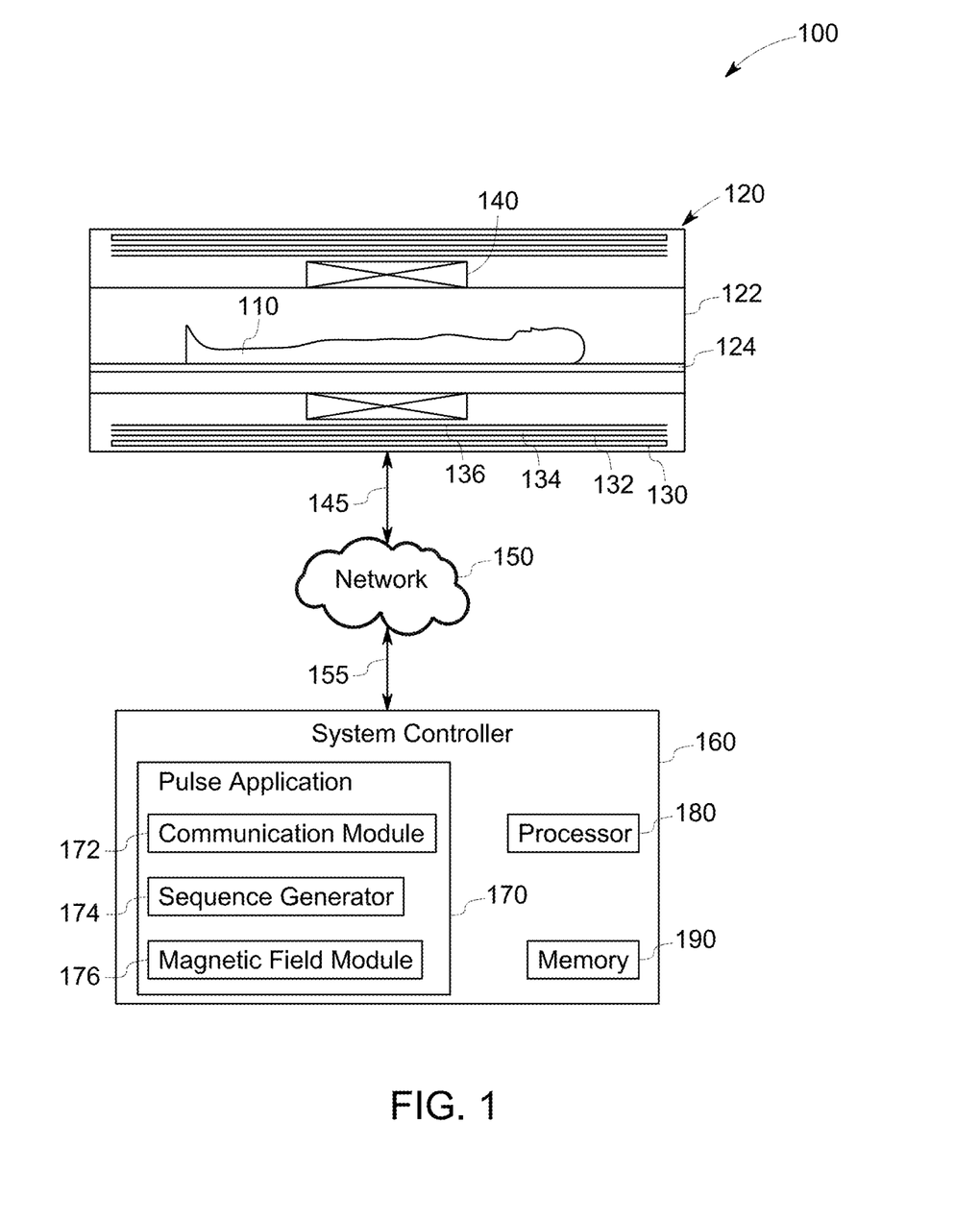
FIG. 1 is a block diagram illustrating an example of a system for estimating a static magnetic (B0) field.

A system and method for estimating a static magnetic (B0) field is described herein. FIG. 1 illustrates an exemplary block diagram of a Magnetic Resonance (MR) system 100 for estimating a B0 field. The system 100 includes an MR scanner 120 and a system controller 160 that are operationally coupled via a network 150. The network 150 may be a wired or wireless type, and may have any number of configurations such as a star configuration, token ring configuration, or other known configurations. Furthermore, the network 150 may include a local area network (LAN), a wide area network (WAN) (e.g., the internet), and/or any other interconnected data path across which multiple devices may communicate. The network 150 may be a peer-to-peer network. The network 150 may also be coupled to or include portions of a telecommunication network for sending data in a variety of different communication protocols. The network 150 may include Bluetooth communication networks or a cellular communications network for sending and receiving data such as via a short messaging service (SMS), a multimedia messaging service (MMS), a hypertext transfer protocol (HTTP), a direct data connection, WAP, email, or the like. The MR scanner 120 and the system controller 160 are coupled to the network 150 via signal lines 145 and 155 respectively. The signal lines 145 and 155 are provided for illustrative purposes and represent the MR scanner 120 and the system controller 160 communicating by wires or wirelessly over the network 150. While only one network 150 is shown coupled to the MR scanner 120 and the system controller 160, multiple networks 150 may be coupled to the entities.

The MR scanner 120 may be any type of scanner configured to scan an object 110 (e.g., a human) by generating a magnetic field around the object 110 and detect a radiofrequency (RF) output signal emitted by hydrogen atoms from a plurality of chemical species in the object 110. The plurality of chemical species in the object 110 may include water, fat, bone marrow, cartilage, and the like. Although FIG. 1 illustrates a human as an object 110, in some implementations, other objects 110, for example, an imaging phantom, an animal, and the like may be scanned by the MR scanner 120.

The MR scanner 120 comprises a patient bore 122 within which a table 124 may be positioned for disposing the object 110 in a desired position for scanning. The MR scanner 120 further comprises a series of associated coils configured to generate a magnetic field. In the illustrated embodiment, the MR scanner 120 includes a primary magnet coil 130 energized via a power supply (not shown) configured to generate the B0 field. The MR scanner 120 further includes a series of gradient coils grouped together in a coil assembly and configured to generate accurately controlled magnetic fields, the strength of which may vary over a designated field of view of the MR scanner 120. The series of gradient coils comprises a slide select gradient ($G_{SS}$) coil 132, a phase encoding ($G_{PE}$) gradient coil 134, and a frequency encoding ($G_{FE}$) gradient coil 136. In some implementations, the magnetic fields generated by the gradient coils 132, 134, and 136 are orthogonally oriented to each other.

The MR scanner 120 further comprises an RF coil 140 configured to receive one or more pulse notifications from the system controller 160 and generate one or more RF pulses, for example, a preparatory RF pulse, a phase sensitive RF pulse sequence, and the like. The preparatory RF pulse and the phase sensitive RF pulse sequence are described below in further detail with reference to the system controller 160. Typically, a net magnetization vector corresponding to nuclear spins of hydrogen atoms from the plurality of chemical species in the object 110 is aligned parallel to the direction of the B0 field. The net magnetization vector is a summation of all magnetization vectors corresponding to nuclear spins of all chemical species in the object 110. An RF pulse generated by the RF coil 140 may cause the hydrogen atoms of the plurality of chemical species to absorb energy and spin in a different direction. Thus, the RF pulse may cause the net magnetization vector to rotate or spiral away from the direction of the B0 field depending on, for example, the amplitude and the time duration of the RF pulse.

Once the RF pulse is turned off, the hydrogen atoms release the absorbed energy and the net magnetization vector returns back to the direction of the B0 field. The time duration taken by the net magnetization vector to return back to the direction of the B0 includes a spin-lattice (T1) relaxation time and spin-spin (T2) relaxation time. The T1 relaxation time is the time taken by the longitudinal component of the net magnetization vector to return back to the direction of the B0 field. The T2 relaxation time is the time taken by the transverse component of the net magnetization vector to return back to the direction of the B0 field. The RF coil 140 is further configured to detect/measure the energy released by the hydrogen atoms (i.e., the RF output signal) when the net magnetization vector is in a direction substantially perpendicular to the direction of the B0 field. The RF coil 140 then sends the RF output signal to the system controller 160 via the network 150.

The system controller 160 may be any type of device configured to send one or more pulse notifications to the MR scanner 120, receive the RF output signal, and estimate the B0 field. The system controller 160 includes a pulse application 170, a processor 180, and a memory 190. The pulse application 170 includes a communication module 172, a sequence generator 174, and a magnetic field module 176. The plurality of modules of the pulse application 170, the processor 180, and the memory 190 are coupled to a bus (not shown) for communication with each other. Although, one system controller 160 is shown in FIG. 1, a plurality of system controllers 160 may be coupled to the network 150.

The processor 180 may include at least one arithmetic logic unit, microprocessor, general purpose controller or other processor arrays to perform computations, and/or retrieve data stored on the memory 190. The processor 180 may be a multiple core processor. The processor 180 processes data signals and may include various computing architectures including a complex instruction set computer (CISC) architecture, a reduced instruction set computer (RISC) architecture, or an architecture implementing a combination of instruction sets. The processing capability of the processor 180 may be limited to supporting the retrieval of data and transmission of data. The processing capability of the processor 180 may also perform more complex tasks, including various types of feature extraction, modulating, encoding, multiplexing, and the like. Other type of processors, operating systems, and physical configurations are also envisioned.

The memory 190 may be a non-transitory storage medium. For example, the memory 190 may be a dynamic random access memory (DRAM) device, a static random access memory (SRAM) device, flash memory or other memory devices. The memory 190 may also include a non-volatile memory or similar permanent storage device, and media such as a hard disk drive, a floppy disk drive, a compact disc read only memory (CD-ROM) device, a digital versatile disc read only memory (DVD-ROM) device, a digital versatile disc random access memory (DVD-RAM) device, a digital versatile disc rewritable (DVD-RW) device, a flash memory device, or other non-volatile storage devices. The memory 190 stores data that is required for the pulse application 170 to perform associated functions. The memory 190 stores the modules (e.g., communication module 172, the sequence generator 174, and the like) of the pulse application 170. The memory 190 stores the T1 relaxation times of one or more chemical species in the object 110. The T1 relaxation times of the one or more chemical species are defined by, for example, an administrator of the system controller 160 based on previously generated clinical data.

The communication module 172 includes codes and routines configured to handle communications between the MR scanner 120 and the modules of the pulse application 170. The communication module 172 may include a set of instructions executable by the processor 180 to provide the functionality for handling communications between the MR scanner 120 and the modules of the pulse application 170. The communication module 172 may be stored in the memory 190 and be accessible and executable by the processor 180. In either case, the communication module 172 is adapted for communication and cooperation with the processor 180 and other modules of the pulse application 170.

The communication module 172 may receive one or more pulse notifications from the sequence generator 174. The communication module 172 sends the one or more pulse notifications to the RF coil 140 of the MR scanner 120 via the network 150. The communication module 172 may receive an RF output signal from the MR scanner 120 via the network 150. The communication module 172 sends the RF output signal to the magnetic field module 176. The communication module 172 may receive a B0 field map from the magnetic field module 176. The communication module 172 sends the B0 field map to, for example, a display device (not shown) configured to display the B0 field map to an administrator of the system controller 160.

The sequence generator 174 includes codes and routines configured to send one or more pulse notifications to the MR scanner 120. The one or more pulse notifications comprise instructions to apply one or more RF pulses to the MR scanner 120. The sequence generator 174 may include a set of instructions executable by the processor 180 to provide the functionality for sending the one or more pulse notifications to the MR scanner 120. The sequence generator 174 may be stored in the memory 190 and be accessible and executable by the processor 180. In either case, the sequence generator 174 is adapted for communication and cooperation with the processor 180 and other modules of the pulse application 170.

The sequence generator 174 is configured to send a first pulse notification at a first time instant to the RF coil 140 of the MR scanner 120. The first pulse notification includes an instruction to apply a preparatory RF pulse to the MR scanner 120. The preparatory RF pulse is configured to flip the net magnetization vector corresponding to the nuclear spins of the plurality of chemical species in the object 110 by 180 degrees. The sequence generator 174 is further configured to send a second pulse notification at a second time instant to the RF coil 140 of the MR scanner 120. The time delay between the first time instant and the second time instant is based on the T1 relaxation time of a first subset of chemical species from the plurality of chemical species. The sequence generator 174 receives the T1 relaxation time of the first subset of chemical species from the memory 190. The second pulse notification includes an instruction to apply a phase sensitive pulse sequence to the MR scanner 120. The phase sensitive pulse sequence comprises an RF pulse (i.e., B1 pulse) that is configured to flip the net magnetization vector in a direction perpendicular to the B0 field. The phase sensitive pulse sequence includes, for example, a two-dimensional (2D) single echo B0 mapping pulse sequence, a 2D dual echo B0 mapping pulse sequence, a three-dimensional (3D) dual echo B0 mapping pulse sequence, a 3D single echo B0 mapping pulse sequence, a fast spoiled gradient echo sequence, and the like.

Figure 2:
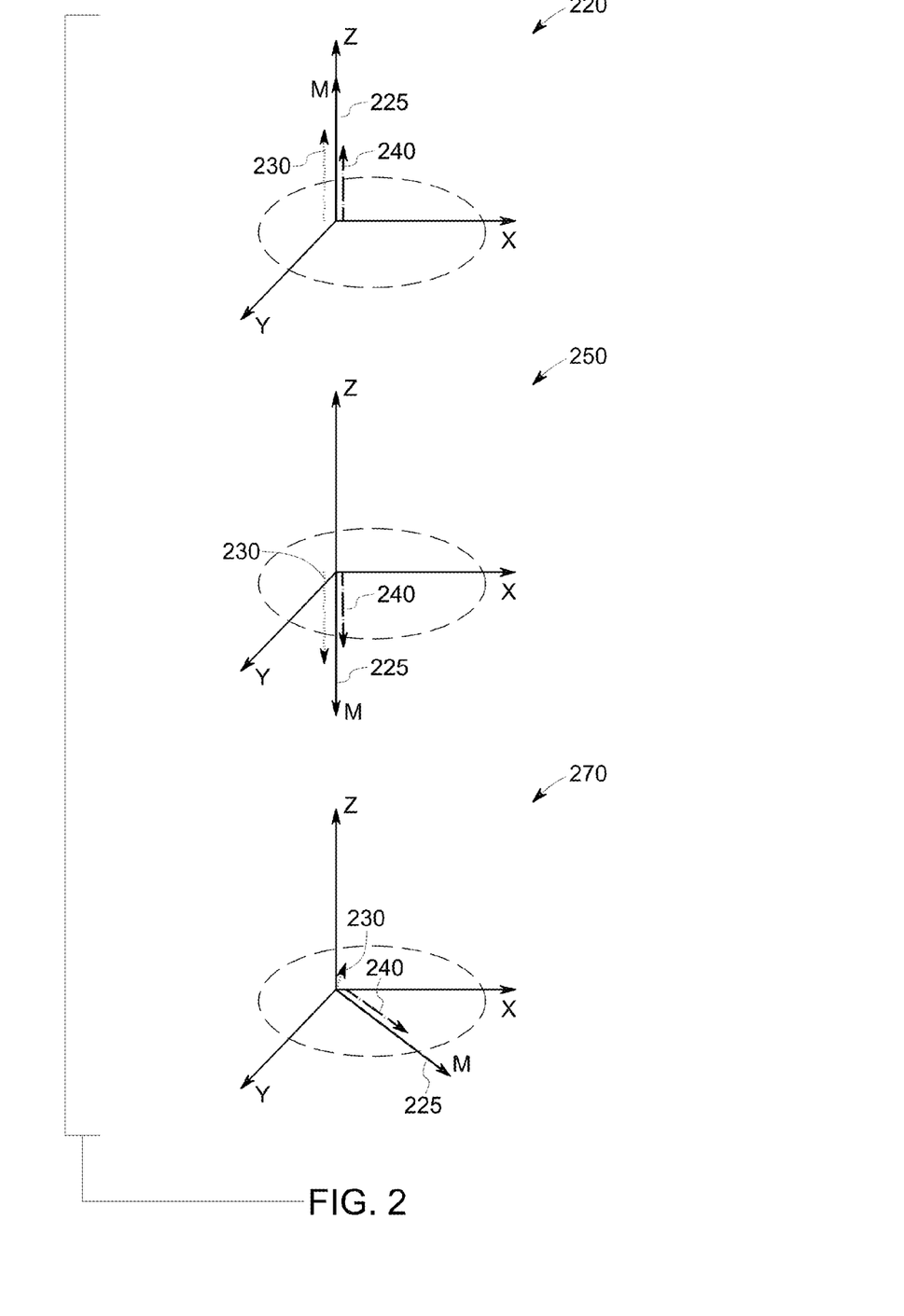
FIG. 2 is a graphical representation illustrating example magnetization vectors corresponding to nuclear spins of a plurality of chemical species in an object.

Referring now to FIG. 2, exemplary graphical representations 220, 250, and 270 of the net magnetization vector of a plurality of chemical species in an object are illustrated. The plurality of chemical species in the object comprises fat molecules as a first subset of chemical species and water molecules as a second subset of chemical species. Furthermore, the B0 field is aligned along the z-axis of the Cartesian co-ordinate system. The graph 220 illustrates the net magnetization vector (M) 225 corresponding to the nuclear spins of a plurality of chemical species prior to the application of a preparatory RF pulse. The net magnetization vector 225 is a summation of a first magnetization vector 230 corresponding to nuclear spins of fat and a second magnetization vector 240 corresponding to the nuclear spins of water. The net magnetization vector 225, the first magnetization vector 230, and the second magnetization vector 240 are aligned parallel to the direction of the B0 field along the z-axis.

The graph 250 illustrates the magnetization vectors after the application of a preparatory RF pulse at a first time instant. The preparatory RF pulse causes the first magnetization vector 230, the second magnetization vector 240, and hence the net magnetization vector 225 to flip by 180 degrees and point along the negative z-axis. The graph 270 illustrates the magnetization vectors after the application of a phase sensitive pulse sequence at a second time instant. The time delay between the preparatory RF pulse and the phase sensitive pulse sequence is based on the T1 relaxation time of fat. For example, the time delay may be based on the equation:

$$\text{Time delay} = T1 \text{ relaxation time of fat} * \ln(2)$$

Where:
  ln(2) is the natural logarithmic value of 2.
  In another example, the time delay may be equal to the T1 relaxation time of fat. Thus, the hydrogen atoms of fat lose the energy absorbed due to the preparatory RF pulse and the first magnetization vector 230 aligns back in a direction parallel to the B0 field (i.e., the z-axis). However, the B1 pulse in the phase sensitive pulse sequence, flips the second magnetization vector 240, and hence the net magnetization vector 225 by 90 degrees into the x-y plane, i.e., in a direction perpendicular to the B0 field. This is because the T1 relaxation time of water is longer than the T1 relaxation time of fat. Although the time delay is based on the T1 relaxation of fat, the time delay may be based on the T1 relaxation time of any chemical species (e.g., water) from the plurality of chemical species in the object.

Referring back to FIG. 1, the magnetic field module 176 includes codes and routines configured to receive an RF output signal and estimate the B0 field. The magnetic field module 176 may include a set of instructions executable by the processor 180 to provide the functionality for receiving the RF output signal and estimating the B0 field. The magnetic field module 176 may be stored in the memory 190 and be accessible and executable by the processor 180. In either case, the magnetic field module 176 is adapted for communication and cooperation with the processor 180 and other modules of the pulse application 170.

The magnetic field module 176 receives the RF output signal in response to the preparatory RF pulse and the B1 pulse of the phase sensitive pulse sequence from the RF coil 140. As mentioned above, the RF coil 140 is configured to detect the RF output signal when the magnetization vector is substantially perpendicular to the direction of the B0 field. Thus, the preparatory RF pulse and the time delay based on the T1 relaxation time of the first subset of chemical species nulls the output signal from the hydrogen atoms in the first subset of chemical species. Hence, the RF output signal received by the magnetic field module 176 comprises an output signal from the hydrogen atoms in the second subset of chemical species in response to the phase sensitive pulse sequence.

The magnetic field module 176 extracts k-space data from the received RF output signal and generates a first phase image corresponding to a first echo time and a second phase image corresponding to a second echo time. The magnetic field module 176 then estimates the B0 field map based on the first phase image and second phase image. The magnetic field module 176 may estimate the B0 field map based on the equation:

$$\text{Field map} = \frac{\Phi_1 - \Phi_2}{2\pi(TE_2 - TE_1)}$$

Where:

$\Phi_1$ and $\Phi_2$ are the first phase and second phase images respectively; and $TE_1$ and $TE_2$ are the first echo time and second echo time respectively.

The magnetic field module 176 further generates graphical data for providing a user interface including the estimated B0 field map to, for example, an administrator of the system controller 160. The magnetic field module 176 may send the graphical data to a display device (not shown) coupled to the system controller 160. The display device (not shown) renders the graphical data and displays the user interface.

Figure 3:
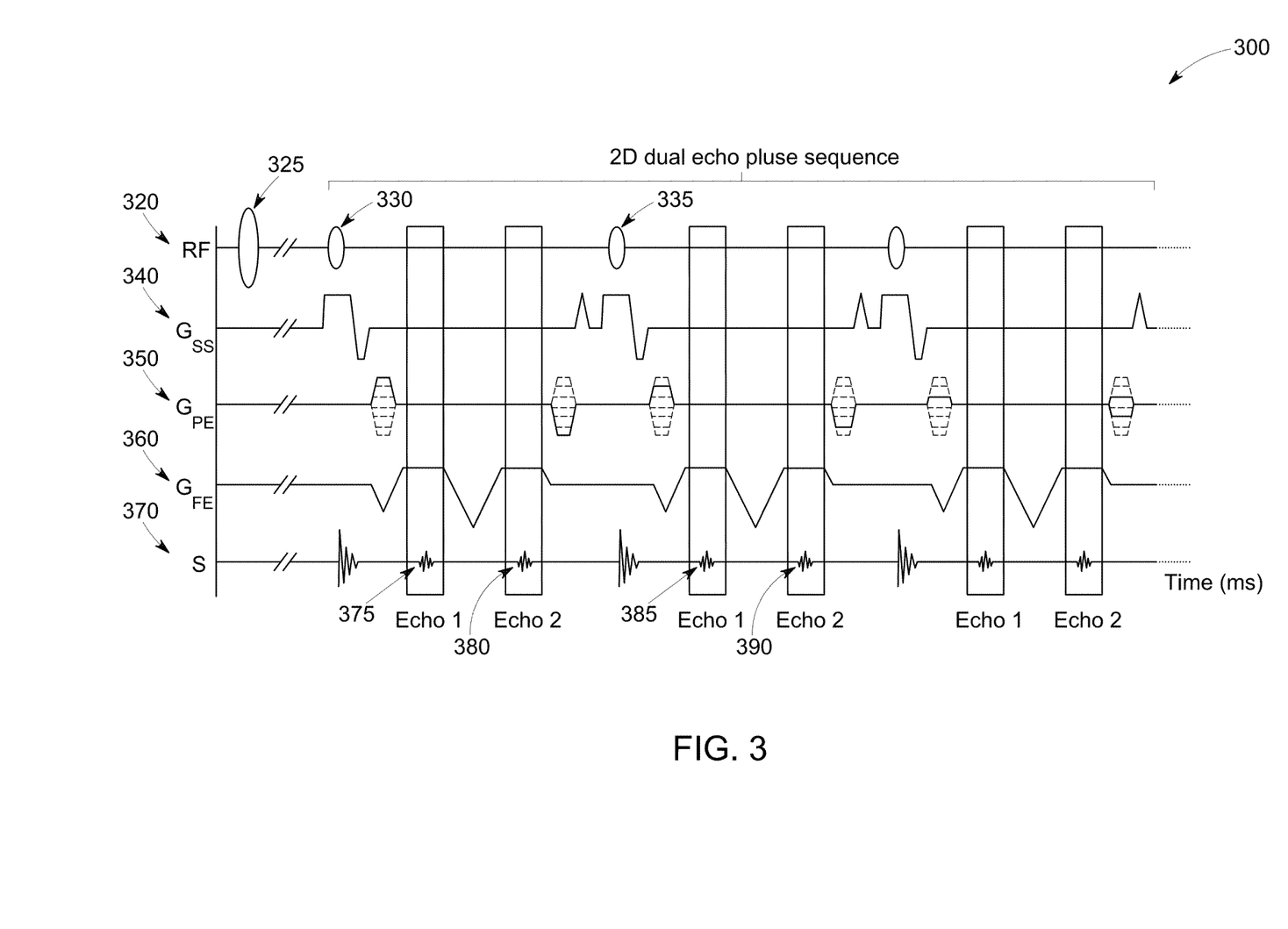
FIG. 3 is a graphical representation illustrating an example of a pulse sequence and a radiofrequency (RF) output signal.

Referring now to FIG. 3 a graphical representation 300 of a pulse sequence and an RF output signal is illustrated. In the graph 300, the x-axis represents the time in milliseconds and the y-axis represents the amplitude of the waveforms 320, 340, 350, 360, and 370. The waveform 320 illustrates the RF pulses applied by the system controller to the MR scanner.

The sequence generator applies a preparatory RF pulse 325 at a first time instant and a 2D dual echo pulse sequence comprising a plurality of B1 pulses 330, 335. The preparatory RF pulse 325 flips a net magnetization vector corresponding to nuclear spins of a plurality of chemical species (e.g., water and fat) in an object by 180 degrees. The sequence generator applies the first B1 pulse 330 at a second time instant, such that the time delay between the first and the second time instants corresponds to the T1 relaxation time of a first subset of chemical species (e.g., fat) in the object. The B1 pulse 330 flips the magnetization vector corresponding to the nuclear spins of the second subset of chemical species (e.g., water) by 90 degrees in a direction perpendicular to the direction of the B0 field.

The waveforms 340, 350, and 360 illustrates the gradient magnetic fields generated by the slice select gradient ($G_{SS}$) coil, the phase encoding ($G_{PE}$) gradient coil, and the frequency encoding ($G_{FE}$) gradient coil of the MR scanner respectively. The waveform 370 illustrates the RF output signal detected by the RF coil of the MR scanner in response to the one or more RF pulses. Since the preparatory RF pulse 325 and the time delay are configured to null the signal due to the nuclear spins of the first subset of chemical species (e.g., fat), the RF output signal corresponds to the nuclear spins of the second subset of chemical species (e.g., water). The magnetic field module generates a first phase image and a second phase image based on the RF output signal at a first echo time 375 and a second echo time 380. The magnetic field module then estimates B0 field map based on the first phase image and the second phase image. The magnetic field module may also optionally use the RF output signal at a first echo time 385 and a second echo time 390 in response to a second B1 pulse 335 to estimate the B0 field.

The estimated B0 field map is advantageous as it corresponds to the nuclear spins of the second subset of chemical species (i.e., water) and is not confounded by the presence of the first subset of chemical species (i.e., fat) plurality of chemical species in the object. This is particularly advantageous in estimating field maps with objects that contain significant amounts of fat, for example, breast tissue, and the like. Although, in the illustrated example, the preparatory RF pulse and the time delay are configured to null the RF output signal due to fat, in other examples the preparatory RF pulse 325 and the time delay may be configured to null the RF output signal due to water. Furthermore, although the RF output signal due to one subset of chemical species is nulled, in other examples, the RF output signal due to multiple chemical species with substantially similar T1 relaxation times may be nulled.

Figure 4:
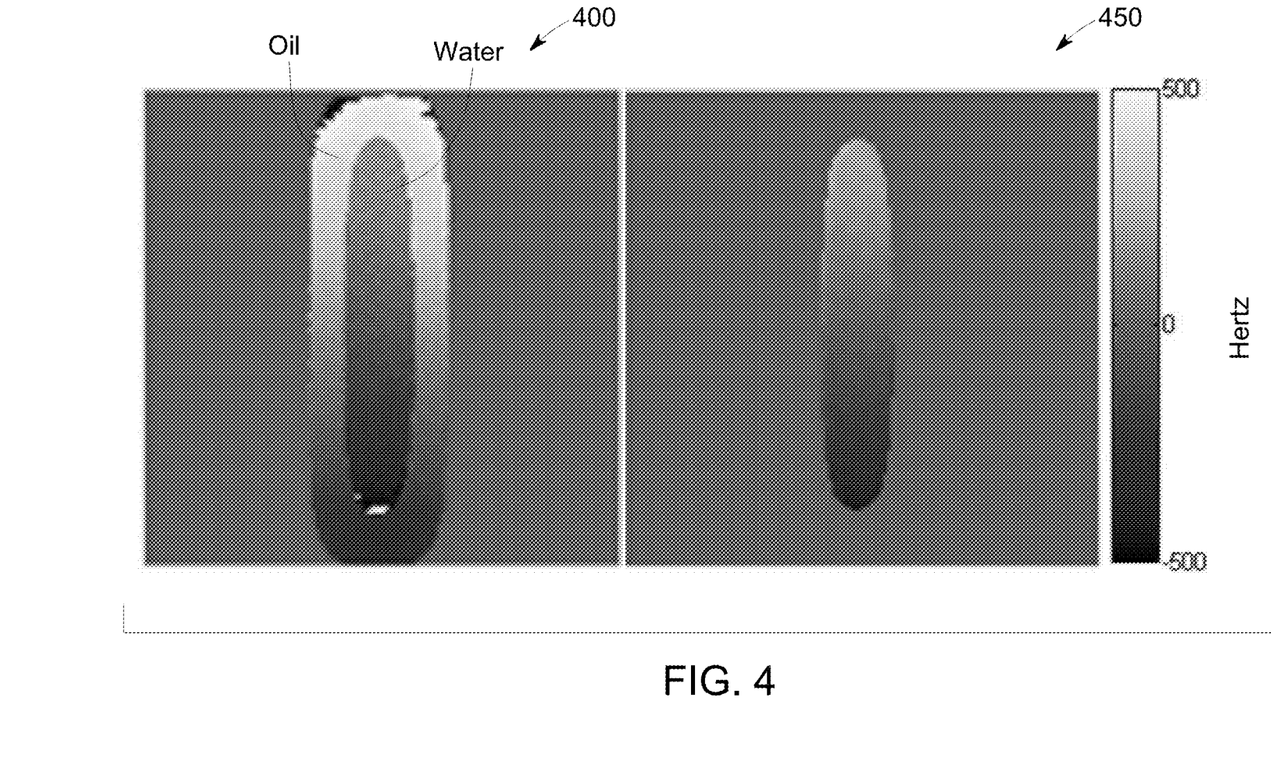
FIG. 4 is a graphical representation of example magnitude images of B0 field maps.

FIG. 4 illustrates graphical representations of B0 field maps 400, 450 estimated in the presence of a concentric cylindrical phantom (i.e., an object). The outer concentric ring of the phantom comprises vegetable oil (i.e., fat) and the inner concentric ring comprises water. The system controller estimates the B0 field map 400 without the application of the preparatory RF pulse. The estimated B0 field map 400 is confounded by the presence of fat in the phantom since the B0 field inhomogeneity and the chemical shift encoded phase are not differentiated. The system controller estimates the B0 field map 450 after the application of the preparatory RF pulse and a time delay based on the T1 relaxation time of fat. Thus, the estimated B0 field map 450 is not confounded by the presence of fat in the phantom.

Figure 5:
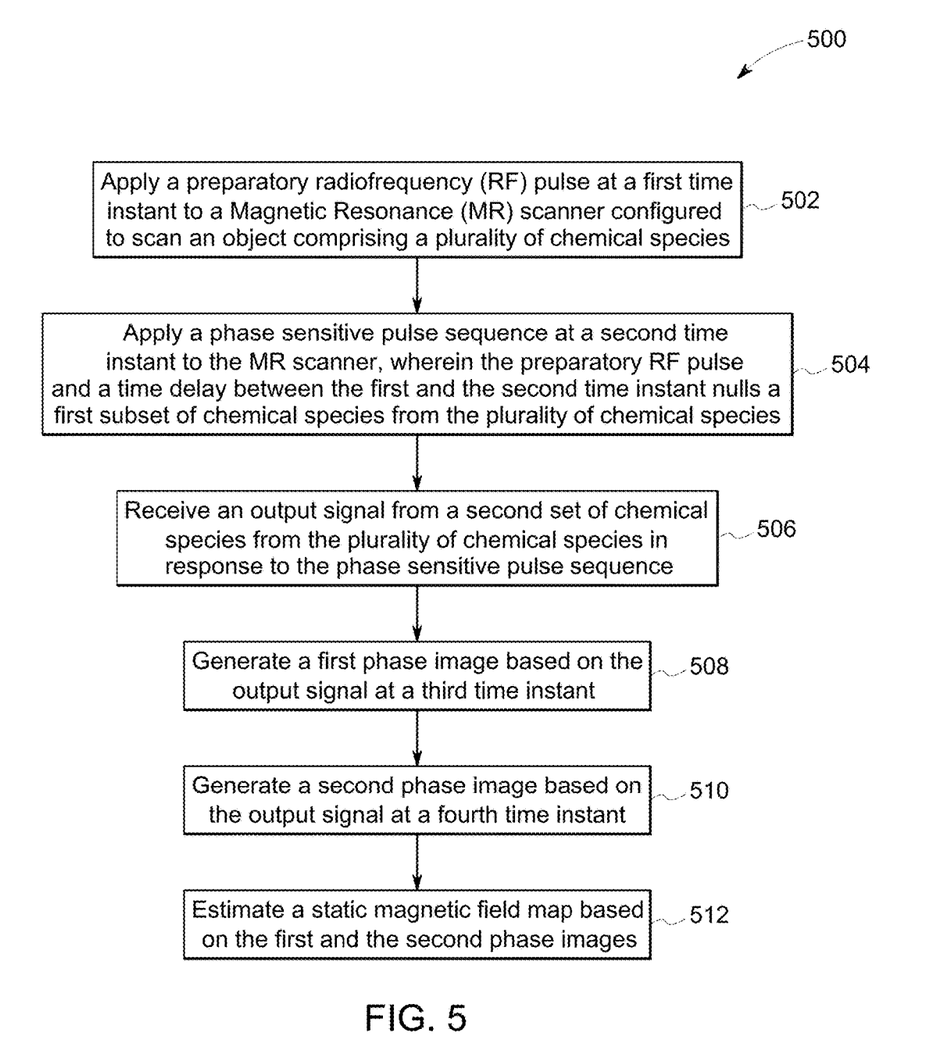
FIG. 5 is a flow diagram illustrating an example of a method for estimating a B0 field map.

FIG. 5 is a flow diagram illustrating a method 500 for estimating a B0 field. The sequence generator applies a preparatory RF pulse at a first time instant to an MR scanner configured to scan an object comprising a plurality of chemical species 502. The sequence generator also applies a phase sensitive pulse sequence at a second time instant to the MR scanner, wherein the preparatory RF pulse and a time delay between the first and the second time instant nulls a first subset of chemical species from the plurality of chemical species 504. The magnetic field module receives an output signal from a second set of chemical species from the plurality of chemical species in response to the phase sensitive pulse sequence 506. The magnetic field module generates a first phase image based on the output signal at a third time instant (i.e., a first echo time) 508. The magnetic field module also generates a second phase image based on the output signal at a fourth time instant (i.e., the second echo time) 510. The magnetic field module then estimates the B0 field map based on the first and the second phase images 512.

It is to be understood that not necessarily all such objects or advantages described above may be achieved in accordance with any particular implementation. Thus, for example, those skilled in the art will recognize that the systems and techniques described herein may be embodied or carried out in a manner that achieves or optimizes one advantage or group of advantages as taught herein without necessarily achieving other objects or advantages as may be taught or suggested herein.

While the technology has been described in detail in connection with only a limited number of implementations, it should be readily understood that the inventions are not limited to such disclosed implementations. Rather, the technology can be modified to incorporate any number of variations, alterations, substitutions or equivalent arrangements not heretofore described, but which are commensurate with the spirit and scope of the disclosure. Additionally, while various implementations of the technology have been described, it is to be understood that aspects of the technology may include only some of the described implementations. Accordingly, the inventions are not to be seen as limited by the foregoing description, but are only limited by the scope of the appended claims.

What is claimed as new and desired to be protected by Letters Patent of the United States is:

1. An MRI method comprising:
   applying a preparatory radiofrequency (RF) pulse at a first time instant to a Magnetic Resonance (MR) scanner configured to scan an object comprising a plurality of chemical species;
   applying a phase sensitive pulse sequence in an RF coil in the MR scanner at a second time instant to the MR scanner, wherein the preparatory RF pulse and a time delay between the first and the second time instants null RF output signal corresponding to nuclear spins of a first subset of chemical species from the plurality of chemical species;
   receiving an RF output signal in an RF coil in the MR scanner corresponding to nuclear spins of a second subset of chemical species from the plurality of chemical species in response to the phase sensitive pulse sequence;
   estimating a static magnetic (B0) field map in a microprocessor based on the RF output signal corresponding to nuclear spins of the second subset of chemical species, wherein the static magnetic (B0) field map is not influenced by the presence of the first subset of chemical species: and
   generating graphical data for providing an user interface including the estimated static magnetic (B0) field map.

2. The method of claim 1, wherein the preparatory RF pulse flips a net magnetization vector corresponding to nuclear spins of the plurality of chemical species by 180 degrees.

3. The method of claim 1, wherein the time delay between the first and second time instants is based on a spin-lattice relaxation time of the first subset of chemical species.

4. The method of claim 1, wherein the first subset of chemical species comprises fat.

5. The method of claim 1, wherein the second subset of chemical species comprises water.

6. The method of claim 1, further comprising generating a first phase image based on the output signal at a third time instant and generating a second phase image based on the output signal at a fourth time instant.

7. The method of claim 6, further comprising estimating the B0 field map based on the first phase image and the second phase image.

8. An MRI system comprising:
   a Magnetic Resonance (MR) scanner configured to scan an object comprising a plurality of chemical species; and
   a system controller operationally coupled to the MR scanner, the system controller comprising:
   at least one processor;
   a sequence generator stored in a memory and executable by the at least one processor, the sequence generator configured to apply a preparatory radiofrequency (RF) pulse at a first time instant to the MR scanner and an RF coil in the MR scanner configured to apply a phase sensitive pulse sequence at a second time instant to the MR scanner, wherein the preparatory RF pulse and a time delay between the first and the second time instants null RF output signal corresponding to nuclear spins of a first subset of chemical species from the plurality of chemical species;
   a magnetic field module stored in the memory and executable by the at least one processor, the magnetic field module communicatively coupled with the sequence generator configured to receive an RF output signal in an RF coil in the MR scanner corresponding to nuclear spins of a second subset of chemical species from the plurality of chemical species in response to the phase sensitive pulse sequence and a microprocessor configured to estimate a static magnetic (B0) field map based on the RF output signal corresponding to nuclear spins of the second subset of chemical species, wherein the static magnetic (B0) field map is not influenced by the presence of the first subset of chemical species; and
   a graphical device configured to generate graphical data for providing a user interface including the estimated static magnetic (B0) field map.

9. The system of claim 8, wherein the preparatory RF pulse flips a net magnetization vector corresponding to nuclear spins of the plurality of chemical species by 180 degrees.

10. The system of claim 8, wherein the time delay between the first and second time instants is based on a spin-lattice relaxation time of the first subset of chemical species.

11. The system of claim 8, wherein the first subset of chemical species comprises fat.

12. The system of claim 8, wherein the second subset of chemical species comprises water.

13. The system of claim 8, wherein magnetic field module is further configured to generate a first phase image based on the output signal at a third time instant, generate a second phase image based on the output signal at a fourth time instant and estimate the B0 field map based on the first phase image and the second phase image.

14. A computer program product comprising a non-transitory computer readable medium configured for use in an MRI machine encoding instructions that, in response to execution by at least one processor, cause the processor to perform operations comprising:
  apply a preparatory radiofrequency (RF) pulse at a first time instant to a Magnetic Resonance (MR) scanner configured to scan an object comprising a plurality of chemical species;
  apply a phase sensitive pulse sequence in an RF coil in the MR scanner at a second time instant to the MR scanner, wherein the preparatory RF pulse and a time delay between the first and the second time instants null RF output signal corresponding to nuclear spins of a first subset of chemical species from the plurality of chemical species;
  receive an RF output signal in an RF coil in the MR scanner corresponding to nuclear spins of a second subset of chemical species from the plurality of chemical species in response to the phase sensitive pulse sequence;
  estimate a static magnetic (B0) field map in a microprocessor based on the RF output signal corresponding to nuclear spins of the second subset of chemical species, wherein the static magnetic (B0) field map is not influenced by the presence of the first subset of chemical species; and
  generate graphical data for providing an user interface including the estimated static magnetic (B0) field map.

15. The computer program product of claim 14, wherein the preparatory RF pulse flips a net magnetization vector corresponding to nuclear spins of the plurality of chemical species by 180 degrees.

16. The computer program product of claim 14, wherein the time delay between the first and second time instants is based on a spin-lattice relaxation time of the first subset of chemical species.

17. The computer program product of claim 14, wherein the first subset of chemical species comprises fat.

18. The computer program product of claim 14, wherein the second subset of chemical species comprises water.

19. The computer program product of claim 14, further causing the processor to perform operations comprising generating a first phase image based on the output signal at a third time instant and generating a second phase image based on the output signal at a fourth time instant.

20. The computer program product of claim 19, further causing the processor to perform operations comprising estimating the B0 field map based on the first phase image and the second phase image.

* * * * *